United States Patent
Kobayashi et al.

(10) Patent No.: US 9,176,204 B2
(45) Date of Patent: Nov. 3, 2015

(54) TMR MAGNETIC SENSOR INCLUDING A CONDUCTIVE MATERIAL AND A PASSIVATION FILM AND MANUFACTURING METHOD THEREFOR

(71) Applicant: Mitsubishi Electric Corporation, Chiyoda-ku, Tokyo (JP)

(72) Inventors: Satoi Kobayashi, Chiyoda-ku (JP); Takaki Sugino, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/458,862

(22) Filed: Aug. 13, 2014

(65) Prior Publication Data
US 2015/0253392 A1    Sep. 10, 2015

(30) Foreign Application Priority Data
Mar. 7, 2014    (JP) ................. 2014-044535

(51) Int. Cl.
| | |
|---|---|
| *G11B 5/39* | (2006.01) |
| *G11B 5/40* | (2006.01) |
| *G01R 33/09* | (2006.01) |
| *G01R 33/00* | (2006.01) |

(52) U.S. Cl.
CPC .......... *G01R 33/098* (2013.01); *G01R 33/0052* (2013.01); *G11B 5/3909* (2013.01); *G11B 5/40* (2013.01)

(58) Field of Classification Search
CPC .. G11B 5/3106; G11B 5/3909; G11B 5/3929; G11B 5/40; G11B 5/33; G11B 5/39; G11B 5/3903; G11B 5/3906; G11B 2005/3996; H01L 43/02; H01L 43/12
USPC .......... 360/323, 324.2, 320, 322, 324, 324.1, 360/324.11, 324.12; 29/603.13, 603.14
See application file for complete search history.

(56) References Cited

U.S. PATENT DOCUMENTS

| | | | |
|---|---|---|---|
| 7,545,608 B2* | 6/2009 | Araki et al. .................... | 360/319 |
| 7,706,109 B2* | 4/2010 | Nichols et al. ............. | 360/324.2 |

(Continued)

FOREIGN PATENT DOCUMENTS

| | | |
|---|---|---|
| JP | 6-251338 A | 9/1994 |
| JP | 2004-93576 A | 3/2004 |

(Continued)

OTHER PUBLICATIONS

Communication dated Mar. 3, 2015 from the Japanese Patent Office in counterpart application No. 2014-044535.

*Primary Examiner* — Jefferson Evans
(74) *Attorney, Agent, or Firm* — Sughrue Mion, PLLC; Richard C. Turner

(57) ABSTRACT

A tunnel magneto-resistance (TMR) magnetic sensor and its manufacturing method are provided in which its degradation of the degree of accuracy of angle detection or the like is not caused due to an electrical discharge current by static electricity. The TMR magnetic sensor includes a TMR sensor element formed on a first face of a substrate with an insulation film interposing therebetween; a conductive material formed on the first face of the substrate, being electrically connected to the substrate; and a passivation film surrounding a surface of the TMR sensor element and that of the conductive material, wherein at least a portion of the conductive material faces toward an opening portion formed in the passivation film.

9 Claims, 7 Drawing Sheets

(56) References Cited

U.S. PATENT DOCUMENTS

| | | |
|---|---|---|
| 2002/0142490 A1 | 10/2002 | Sato et al. |
| 2004/0189295 A1 | 9/2004 | Sato et al. |
| 2004/0212360 A1 | 10/2004 | Sato et al. |
| 2005/0141143 A1* | 6/2005 | Ono et al. .................. 360/323 |
| 2006/0146450 A1* | 7/2006 | Beach et al. ................ 360/323 |
| 2006/0198057 A1* | 9/2006 | Leung et al. ................ 360/323 |
| 2007/0182407 A1 | 8/2007 | Sato et al. |
| 2009/0015251 A1 | 1/2009 | Azumi et al. |
| 2009/0057795 A1 | 3/2009 | Ishio |
| 2013/0224943 A1* | 8/2013 | Hsieh et al. ................ 438/591 |
| 2015/0104882 A1* | 4/2015 | Jung et al. ..................... 438/3 |

FOREIGN PATENT DOCUMENTS

| | | |
|---|---|---|
| JP | 2009-20092 A | 1/2009 |
| JP | 2010-266337 A | 11/2010 |
| JP | 5243147 B2 | 7/2013 |

* cited by examiner

TMR MAGNETIC SENSOR INCLUDING A CONDUCTIVE MATERIAL AND A PASSIVATION FILM AND MANUFACTURING METHOD THEREFOR

BACKGROUND OF THE INVENTION

1. Field of the Invention

The present invention relates to a TMR magnetic sensor utilizing a tunnel magneto-resistance (TMR) effect, and a method of manufacturing the same.

2. Description of the Related Art

As it is well known that, in a magnetic sensor utilizing the TMR effect (hereinafter referred to as a "TMR magnetic sensor"), when a magnetization direction of a fixed layer and a magnetization direction of a free layer are in parallel with each other, a current flowing through a tunnel oxide film becomes larger, and a resistance value of the magnetic sensor becomes smaller; whereas, when the magnetization direction of the fixed layer and the magnetization direction of the free layer are in antiparallel with each other, the current flowing through the tunnel oxide film becomes smaller, and the resistance value of the magnetic sensor becomes larger. In recent years, active developments have been underway for a rotation angle sensor utilizing such a TMR magnetic sensor. Meanwhile, because the rotation angle sensor is placed adjoining to a rotating member, the sensor is likely to become electrically charged due to static electricity from the outside. In a TMR magnetic sensor using a very thin insulation film of its thickness at several nanometers [nm], the insulation film may be brought to breakdown by an electrical discharge current of the static electricity; for this reason, countermeasures against the static electricity are required from a stage of manufacturing a TMR magnetic sensor element.

As an example in which countermeasure against the static electricity is taken from a stage of manufacturing a magnetic sensor element, for example, according to a conventional technique constituting of a magnetic sensor using a magneto-resistance element (MRE), the technique is disclosed in that, after the magnetic sensor element has been surrounded by a conductive material in a shape of ring, the conductive material is connected to a fixed voltage potential (for example, refer to Japanese Patent No. 5243147).

Problems to be Solved by the Invention

According to a conventional technique disclosed in Japanese Patent No. 5243147, there arise problems in that an effect of countermeasure against static electricity cannot be obtained until a conductive film is connected to a specific voltage potential, and in addition that, because a magnetic sensor element is surrounded by a magnetic material in a shape of ring and also one portion of the magnetic material is connected to a fixed voltage potential, the degree of angle detecting accuracy is degraded as a rotation angle sensor due to the effect of magnetic noise caused by an electrical discharge current of static electricity.

The present invention has been directed at solving these problems in the conventional technique described above, and an object of the invention is to provide a TMR magnetic sensor in which its degradation of the degree of accuracy of angle detection or the like is not caused due to an electrical discharge current by static electricity.

In addition, an object of the present invention is to provide a method of manufacturing a TMR magnetic sensor having a TMR magnetic sensor element therein in which an effect of countermeasure against static electricity can be obtained from a stage of manufacturing the TMR magnetic sensor element.

SUMMARY OF THE INVENTION

Means for Solving the Problems

A TMR magnetic sensor according to the present invention comprises:
a TMR sensor element formed on a first face of a substrate with an insulation film interposing therebetween;
a conductive material formed on the first face of the substrate, being electrically connected to the substrate; and
a passivation film surrounding a surface of the TMR sensor element and that of the conductive material, wherein
at least a portion of the conductive material faces toward an opening portion formed in the passivation film.

A method of manufacturing a TMR magnetic sensor according to the present invention is characterized in that
the conductive material is made before a film formation of a TMR film to be forming the TMR sensor element therein.

In addition, a method of manufacturing a TMR magnetic sensor according to the present invention comprises the steps of:
forming a TMR film to be forming the TMR sensor element therein;
forming the TMR sensor element by processing the TMR film, using etching, into a desired shape, and at the same time forming a lower electrode and the conductive material; and
forming in the passivation film the opening portion corresponding to at least a portion of the conductive material.

Moreover, a method of manufacturing a TMR magnetic sensor according to the present invention comprises the steps of:
forming a TMR film to be forming the TMR sensor element therein;
forming the TMR sensor element by processing the TMR film, using etching, into a desired shape, and at the same time forming a TMR dummy element being electrically connected to the conductive material, and a connecting portion electrically connecting between the TMR sensor element and the TMR dummy element; and
separating the TMR sensor element from the conductive material to one another by cutting off the connecting portion.

Effects of the Invention

According to the TMR magnetic sensor of the present invention, the TMR sensor element therein can be protected from breakdown by static electricity. In addition, because a shape of the conductive material is arbitrary, magnetic noise caused by an electrical discharge current of static electricity is not influenced, so that the sensing can be achieved in high degree of accuracy.

In addition, according to the method of manufacturing the TMR magnetic sensor of the present invention, the conductive material is made before a film formation of a TMR film to be forming the TMR sensor element therein, so that the conductive material being electrically connected to the substrate is formed before the film formation of TMR film, and thus countermeasure against static electricity can be taken from an early stage of wafer processing.

Moreover, according to the method of manufacturing the TMR magnetic sensor of the present invention, the method comprises the steps of: forming a TMR film to be forming the TMR sensor element therein; forming the TMR sensor element by processing the TMR film, using etching, into a desired shape, and at the same time forming a lower electrode and the conductive material; and forming in the passivation film the opening portion corresponding to at least a portion of the conductive material, so that a resistance value of the conductive material can be reduced less than that of the TMR sensor element, and thus countermeasure against static electricity can be strengthened. In addition, because manufacturing process steps of the TMR sensor element and those of the conductive material are made in common, countermeasure against static electricity can be taken from the time of forming the TMR sensor element, and in addition an increase in manufacturing costs can be curbed.

In addition, the method of manufacturing the TMR magnetic sensor according to the present invention comprises the steps of: forming a TMR film to be forming the TMR sensor element therein; forming the TMR sensor element by processing the TMR film, using etching, into a desired shape, and at the same time forming a TMR dummy element being electrically connected to the conductive material, and a connecting portion electrically connecting between the TMR sensor element and the TMR dummy element; and separating the TMR sensor element from the conductive material to one another by cutting off the connecting portion, so that, because static electricity flows toward the side into the conductive material by way of the connecting portion(s) even if the static electricity produced at the time of wafer processing is induced in the TMR element portions, an effect of countermeasure against the static electricity can be strengthened at the time of wafer processing. By removing the connecting portion(s) at a following process step, the TMR sensor element and the conductive material are separated to one another, so that the TMR sensor element functions as a normal TMR sensor element after having finished the wafer processing.

BRIEF DESCRIPTION OF DRAWINGS

The foregoing and other objects, features, aspects and advantages of the present invention will become more apparent from the following detailed description of the present invention when taken in conjunction with the accompanying drawings.

DETAILED DESCRIPTION OF THE PREFERRED EMBODIMENTS

Hereunder, preferred embodiments according to the present invention will be described in detail with reference to the accompanying drawings.

Embodiment 1

Figure 1:
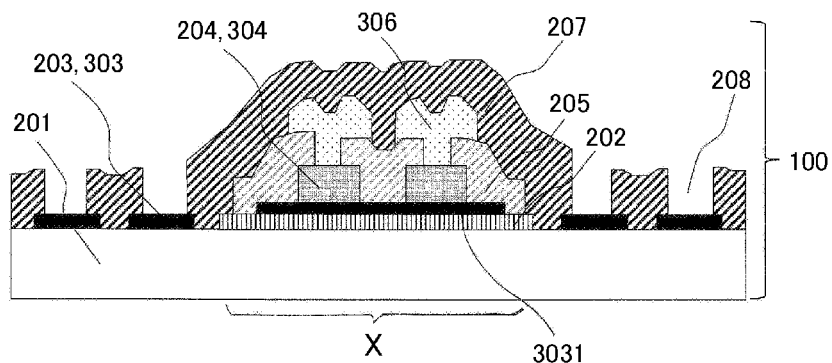
FIG. 1 is a cross-sectional diagram of a TMR magnetic sensor according to Embodiment 1 of the present invention.
Figure 2:
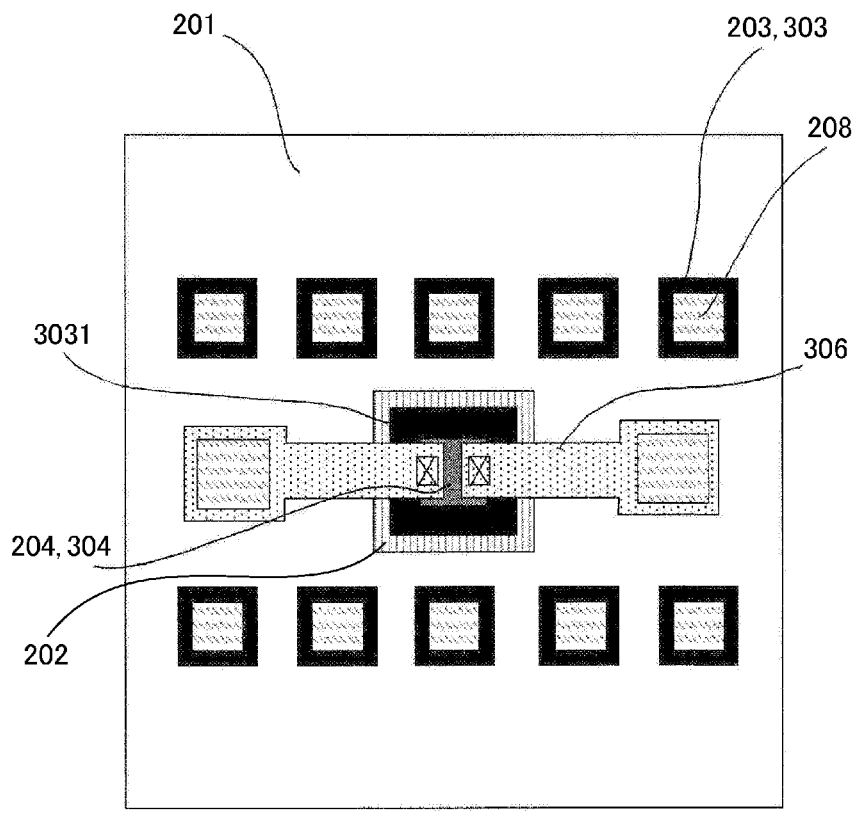
FIG. 2 is an illustrative diagram for explaining the TMR magnetic sensor according to Embodiment 1 of the present invention.

FIG. 1 is a cross-sectional diagram of a TMR magnetic sensor according to Embodiment 1 of the present invention; and FIG. 2 is an illustrative diagram for explaining the TMR magnetic sensor according to Embodiment 1 of the present invention, schematically illustrating a top view of the TMR magnetic sensor 100, and does not correspond to the cross-sectional diagram of FIG. 1. In FIG. 1 and FIG. 2, the TMR magnetic sensor 100 is constituted of silicon-semiconductor (Si) substrate 201, an Si oxide film 202 formed on a surface corresponding to a TMR-sensor-element forming region X of the Si substrate 201, a lower electrode layer 3031 formed on a surface of the Si oxide film 202, conductive materials 303 formed on a surface of the Si substrate 201, opening portions 208 partially formed on the conductive materials 303, an interlayer insulation film 205, a pair of metallic interconnect layers 306 making an ohmic contact with a TMR sensor element 304, and a passivation film 207.

The TMR magnetic sensor 100 structured in such a manner according to Embodiment 1 of the present invention utilizes that, by way of the TMR sensor element 304 and the lower electrode layer 3031, a current that flows between the pair of metallic interconnect layers 306 varies in accordance with the strength of magnetic field applied to the TMR sensor element 304; the sensor is placed, for example, adjoining to a rotating member in an onboard internal-combustion engine, and is used as a rotation angle sensor for detecting an angle of rotation of the rotating member in the internal-combustion engine.

The structure is adopted in that, because static electricity from outside of the TMR magnetic sensor 100 flows through the conductive materials 303 electrically connected to the Si substrate 201 on the side into the Si substrate 201, the TMR sensor element 304 can be protected from the static electricity. For this reason, it is effective when the sensor is used under the environment where it is likely to become electrically charged due to static electricity or the like from the outside, in particular when used adjoining to the rotating member in the onboard internal-combustion engine, for example.

Next, the explanation will be made for a method of manufacturing the TMR magnetic sensor according to Embodiment 1 of the present invention. FIG. 3A to FIG. 3G are illustrative diagrams for explaining first to seventh process steps in the method of manufacturing the TMR magnetic sensor according to Embodiment 1 of the present invention, respectively. First, at the first process step shown in FIG. 3A, the Si substrate (also referred to as a silicon "wafer") 201 is prepared on a surface of which the Si oxide film 202 is formed at the film thickness of 500 nanometers [nm], for example. Note that, as for the Si substrate 201, it is better to preferably use a p-type Si substrate in which boron or the like is doped in advance, for example.

At the second process step shown in FIG. 3B, the TMR-sensor-element forming region X is made approximately in a square shape by processing the Si oxide film 202 as illustrated in FIG. 1 and FIG. 2; next, for example, using physical vapor deposition (PVD) equipment, a lower electrode layer 203 as a TMR-film seed layer (hereinafter, may also be referred to as a "lower electrode layer" for simplicity) made of non-magnetic metal of, for example, Ta, Ru, Cu, Ti, or the like is formed on an exposed surface of the Si substrate 201, and on a surface of the Si oxide film 202 as the TMR-sensor-element forming region X. Next, on the overall surface of the lower electrode layer 203, a TMR film 204 made of an antiferromagnetic layer, a fixed layer, an insulation layer, a free layer and a cap layer (not shown in the figures for these layers) is deposited. In Embodiment 1 of the present invention, film specifications are not in particular defined for the TMR film 204; it is only necessary that any layered structure and kinds of films, materials, and the film thickness may be adopted if the TMR effect is confirmed in the structure.

Figure 3A:
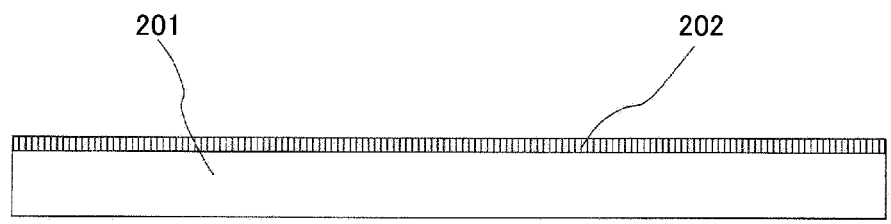
FIG. 3A is an illustrative diagram for explaining a first process step in a method of manufacturing the TMR magnetic sensor according to Embodiment 1 of the present invention.
Figure 3B:
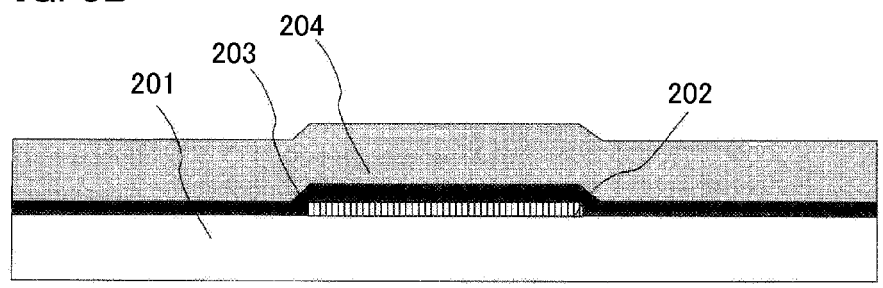
FIG. 3B is an illustrative diagram for explaining a second process step in the method of manufacturing the TMR magnetic sensor according to Embodiment 1 of the present invention.
Figure 3C:
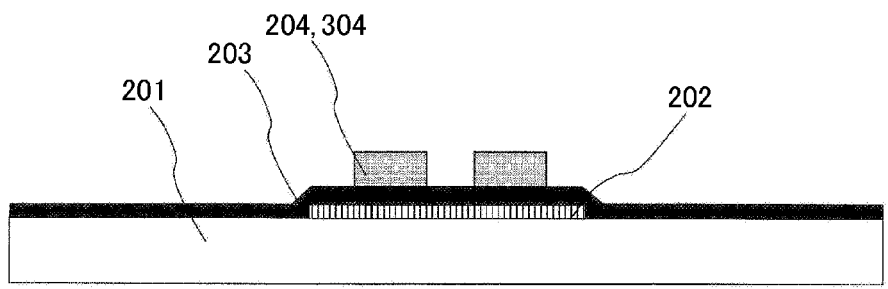
FIG. 3C is an illustrative diagram for explaining a third process step in the method of manufacturing the TMR magnetic sensor according to Embodiment 1 of the present invention.

At the third process step shown in FIG. 3O, portions of the TMR film 204 having been formed at the second process step shown in FIG. 3B described above are selectively removed into a desired pattern by subjecting it to etching by using a technique of photoengraving or the like, so that the TMR sensor element 304 is formed. The selective removal of the TMR film 204 by the etching is, for example, performed using ion beam etching (IBE) equipment. Here, an etching performing time for the selective removal of the TMR film 204 is such an etching performing time when the lower electrode layer 203 as a TMR-film seed layer sufficiently remains as an electrode film.

The "etching time when the lower electrode layer 203 as a TMR-film seed layer sufficiently remains as an electrode film" described above means, in a case in which contact holes described below are to be formed at the lower electrode layer 203 using etching equipment such as reactive ion etching (RIE) equipment, an etching time when the lower electrode layer 203 remains as it is having the film thickness sufficiently capable of exerting the function as an electrode, even if the film thickness of the lower electrode layer 203 is reduced due to over-etching in the etching equipment.

Figure 3D:
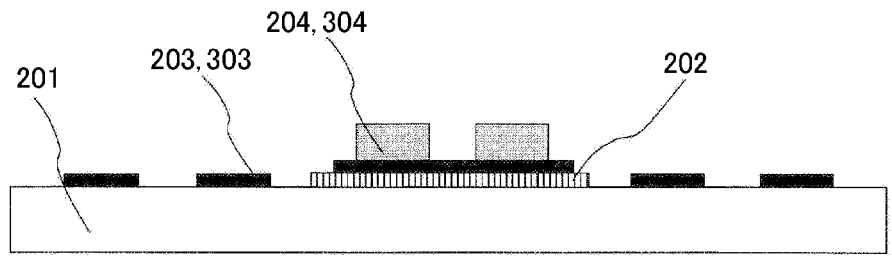
FIG. 3D is an illustrative diagram for explaining a fourth process step in the method of manufacturing the TMR magnetic sensor according to Embodiment 1 of the present invention.

Next, in order to separate the TMR sensor element 304 from the lower electrode layer 203 other than a portion of the layer at the TMR-sensor-element forming region X, at the fourth process step shown in FIG. 3D, the lower electrode layer 203 is selectively removed into a desired pattern by subjecting it to etching, using a technique of photoengraving or the like. And then, in the remaining lower electrode layer 203 after the removal by the etching, the lower electrode layer 203 residing in the TMR-sensor-element forming region X is made as the lower electrode layer 3031 of the TMR magnetic sensor 100, and other portions of the layer are made as the separated conductive materials 303 apart from the TMR-sensor-element forming region X.

According to the above, the conductive materials 303 electrically connected to the Si substrate 201 are formed, and at the same time the lower electrode layer 3031 as a TMR-film seed layer is formed on a surface of the Si oxide film 202 in the TMR-sensor-element forming region X. The conductive materials 303 electrically connected to the Si substrate 201 are formed in such a manner that each of the materials is in a square shape, and, as well-illustrated in FIG. 2, are arranged in lines of two, on both sides interposing the TMR-sensor-element forming region X therebetween. Each of the lines of the conductive materials 303 is arranged to include the five independent conductive materials 303. Note that, any size and/or shape may be adopted therefor, if one of the conductive materials 303 has size that can be formed using semiconductor processing, and is lower in resistance than that of the TMR sensor element 304.

Figure 3E:
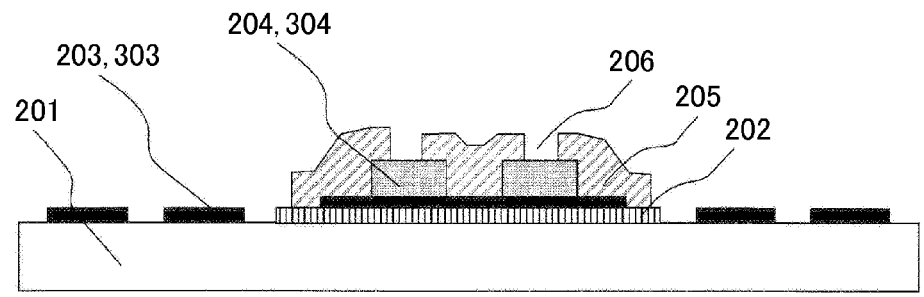
FIG. 3E is an illustrative diagram for explaining a fifth process step in the method of manufacturing the TMR magnetic sensor according to Embodiment 1 of the present invention.

Subsequently, in order to maintain electrical insulation between the layers of the TMR sensor element 304 at the fifth process step shown in FIG. 3E, a silicon nitride film is, for example, deposited on a surface of the TMR-sensor-element forming region X until the film thickness secures the electrical insulation, using plasma-enhanced chemical vapor deposition (PECVD) equipment, so that the interlayer insulation film 205 is formed. Here, the film thickness that secures the electrical insulation means a film thickness in which electrical insulation breakdown does not occur in the interlayer insulation film 205 even when an electric power-source voltage is continuously kept on being supplied thereto for ten years.

Next, by using a photoengraving technique and an etching technique employing reactive ion etching (RIE) equipment, the interlayer insulation film 205 is selectively removed by subjecting it to etching under processing conditions in which ohmic contacts are maintained with the TMR sensor element 304 and portions of the lower electrode layer 3031. According to the above, contact holes 206 are formed in the interlayer insulation film 205 as shown in FIG. 3E.

Figure 3F:
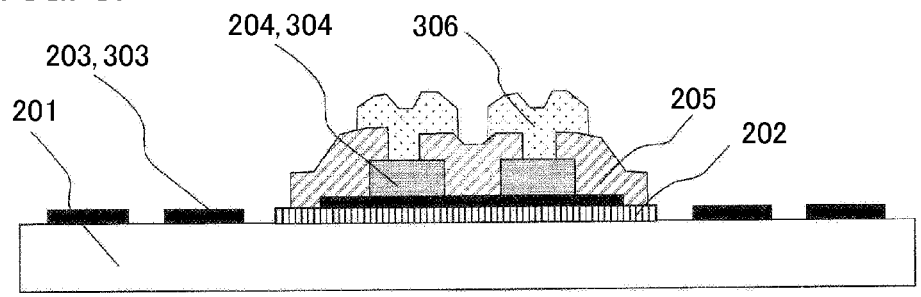
FIG. 3F is a cross-sectional diagram in a stage partway manufacturing the TMR magnetic sensor at a sixth process step in the method of manufacturing the TMR magnetic sensor according to Embodiment 1 of the present invention.

Next, in order to form the metallic interconnect layers 306 at the sixth process step shown in FIG. 3F, an AlSiCu film is deposited until a desired film thickness is obtained, using physical vapor deposition (PVD) equipment. Note that, as for a material of the metallic interconnect layers 306, the material is not limited to the AlSiCu film if an electrical resistance value of the material is low, and it can obtain an ohmic contact with the TMR sensor element 304. In addition, the term "desired film thickness" here means a film thickness in which its reliability is maintained for at least ten years even when electrical and physical stresses are added to the metallic interconnect layers 306. That is, to be straightforward, the film thickness of AlSiCu film means a film thickness in which its migration resistance is maintained.

Subsequently, in a similar manner when the contact holes 206 described above are formed, the AlSiCu film is removed into a desired pattern by subjecting it to etching using a photoengraving technique and an etching technique employing reactive ion etching (RIE) equipment, so that the pair of metallic interconnect layers 306 shown in FIG. 3F is formed.

Figure 3G:
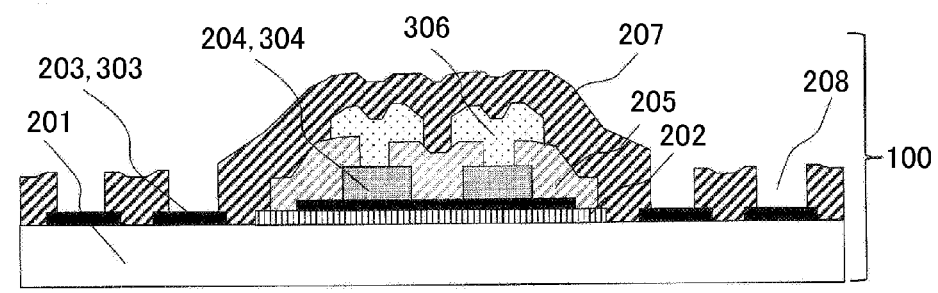
FIG. 3G is an illustrative diagram for explaining a seventh process step in the method of manufacturing the TMR magnetic sensor according to Embodiment 1 of the present invention.

Next, in order to protect the surface of the TMR magnetic sensor at the seventh process step shown in FIG. 3G, a silicon nitride film is, for example, deposited on the overall surface until the film thickness sufficiently secures the function as a desired passivation film 207, using plasma-enhanced chemical vapor deposition (PECVD) equipment. And lastly, by a photoengraving technique and reactive ion etching (RIE) equipment, the silicon nitride film is selectively removed by subjecting it to etching, so that the opening portions 208 are formed. According to the above, the TMR magnetic sensor 100 shown in FIG. 3G and thus in FIG. 1 is finished that includes the TMR sensor element 304, and the conductive materials 303 for flowing static electricity on the side into the Si substrate 201.

Note that, in a case in which the TMR sensor element 304 and a control circuit of the TMR sensor element 304 are to be formed on the same semiconductor substrate, it is possible to form them thereon according to a similar manner described above, if the TMR-sensor-element forming region X is formed in advance.

In the TMR magnetic sensor 100 according to Embodiment 1 of the present invention described above, countermeasure against static electricity can be taken from a stage of wafer processing through the conductive materials 303 on the Si substrate 201 formed in the same chip with the TMR sensor element 304. Because static electricity produced during the wafer processing, and static electricity produced after the wafer processing, during assembling process steps and thereafter, flow on the side into the Si substrate 201 by way of the opening portions 208 through the conductive materials 303 that are lower in voltage potentials and also lower in resistance with respect to the TMR sensor element 304, the TMR sensor element 304 can be protected from breakdown by the static electricity. In addition, because shapes of the conductive materials 303 are arbitrary, and it is not necessary to connect them to a fixed voltage potential from one portion of ring-shape surrounding a sensor element portion in a shape of ring as set forth in Japanese Patent Publication No. 5243147, the effect of magnetic noise produced by an electrical discharge current of static electricity is difficult to be received, so that the sensing can be achieved in high degree of accuracy.

Embodiment 2

Next, the explanation will be made for a TMR magnetic sensor according to Embodiment 2 of the present invention, and a method of manufacturing the same. FIG. 4A to FIG. 4E are illustrative diagrams for explaining first to fifth process steps in the method of manufacturing the TMR magnetic sensor according to Embodiment 2 of the present invention, respectively.

First, the Si substrate 201 is prepared on a surface of which the Si oxide film 202 is formed at the film thickness of 500 nanometers [nm], for example. Note that, as for the Si substrate 201, it is better to preferably use a p-type Si substrate in which boron or the like is doped in advance, for example. Next, the TMR-sensor-element forming region X is made approximately in a square shape by processing the Si oxide film 202 as illustrated in FIG. 1 and FIG. 2.

Next, on the Si substrate (also referred to as a silicon "wafer") 201 on which the Si oxide film 202 is formed, a metal film 401 of AlSiCu or the like is deposited until a desired film thickness is obtained, using physical vapor deposition (PVD) equipment. Note that, as for a material of the metal film 401, the material is not in particular limited to the AlSiCu film if an electrical resistance value of the material is low, and it can obtain an ohmic contact with the Si substrate 201. Subsequently, using a photoengraving technique and an etching technique, the metal film 401 is removed into a desired pattern by subjecting it to etching, and the metal film 401 is formed that makes an ohmic contact with the Si substrate 201. This state is the first process step shown in FIG. 4A.

Next, for example, using physical vapor deposition (PVD) equipment, a lower electrode layer 203 as a TMR-film seed layer (hereinafter, may also be referred to as a "lower electrode layer" for simplicity) made of non-magnetic metal of, for example, Ta, Ru, Cu, Ti, or the like is formed on an exposed surface of the Si substrate 201, a surface of the metal film 401, and a surface of the Si oxide film 202 as the TMR-sensor-element forming region X. Next, on the overall surface of the lower electrode layer 203, the TMR film 204 made of an antiferromagnetic layer, a fixed layer, an insulation layer, a free layer and a cap layer (not shown in the figures for these layers) is deposited. In Embodiment 2 of the present invention, film specifications are not in particular defined for the TMR film 204; it is only necessary that any layered structure and kinds of films, materials, and the film thickness may be adopted if the TMR effect is confirmed in the structure.

Next, portions of the TMR film 204 are selectively removed into a desired pattern by subjecting it to etching by using a technique of photoengraving or the like, so that the TMR sensor element 304 is formed. This state is the second process step shown in FIG. 4B.

The selective removal of the TMR film 204 by the etching is, for example, performed using ion beam etching (IBE) equipment. Here, an etching performing time for the selective removal of the TMR film 204 is such an etching performing time when the lower electrode layer 203 as a TMR-film seed layer sufficiently remains as an electrode film.

The "etching time when the lower electrode layer 203 as a TMR-film seed layer described above sufficiently remains as an electrode film" means, in a case in which contact holes described below are to be formed at the lower electrode layer 203 using etching equipment such as reactive ion etching (RIE) equipment, an etching time when the lower electrode layer 203 remains as it is having the film thickness sufficiently capable of exerting the function as an electrode, even if the film thickness of the lower electrode layer 203 is reduced due to over-etching in the etching equipment.

In order to separate the TMR sensor element 304 from the lower electrode layer 203 other than a portion of the layer at the TMR-sensor-element forming region X, the lower electrode layer 203 is selectively removed into a desired pattern by subjecting it to etching, using a technique of photoengraving or the like. And then, in the remaining lower electrode layer 203 after the removal by the etching, the lower electrode layer 203 residing in the TMR-sensor-element forming region X is made as the lower electrode layer 3031 of the TMR magnetic sensor 100, and other portions of the layer are made as the separated conductive materials 303 apart from the TMR-sensor-element forming region X.

According to the above, the conductive materials 303 electrically connected to the Si substrate 201 are formed, and at the same time the lower electrode layer 3031 as a TMR-film seed layer is formed on a surface of the Si oxide film 202 in the TMR-sensor-element forming region X. The conductive materials 303 electrically connected to the Si substrate 201 are formed in such a manner that each of the materials is in a square shape, and, as well-illustrated in FIG. 2, are arranged in lines of two, on both sides interposing the TMR-sensor-element forming region X therebetween. Each of the lines of the conductive materials 303 is arranged to include the five independent conductive materials 303. Note that, any size and/or shape may be adopted therefor, if one of the conductive materials 303 has size that can be formed using semiconductor processing, and is lower in resistance than that of the TMR sensor element 304.

Subsequently, in order to maintain electrical insulation between the layers of the TMR sensor element 304, a silicon nitride film is, for example, deposited on a surface of the TMR-sensor-element forming region X until the film thickness secures the electrical insulation, using plasma-enhanced chemical vapor deposition (PECVD) equipment, so that the interlayer insulation film 205 is formed. Here, the film thickness that secures the electrical insulation means a film thickness in which electrical insulation breakdown does not occur in the interlayer insulation film 205 even when an electric power-source voltage is continuously kept on being supplied thereto for ten years.

Next, by using a photoengraving technique and an etching technique employing reactive ion etching (RIE) equipment, the interlayer insulation film 205 is selectively removed by subjecting it to etching under processing conditions in which ohmic contacts are maintained with the TMR sensor element 304 and portions of the lower electrode layer 3031. According to the above, the contact holes 206 are formed in the interlayer insulation film 205. This state is the third process step shown in FIG. 4C.

Figure 4A:
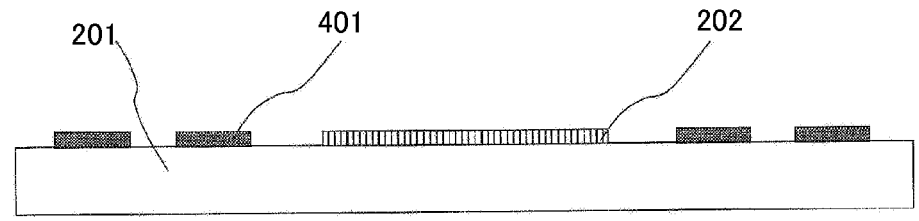
FIG. 4A is an illustrative diagram for explaining a first process step in a method of manufacturing a TMR magnetic sensor according to Embodiment 2 of the present invention.
Figure 4B:
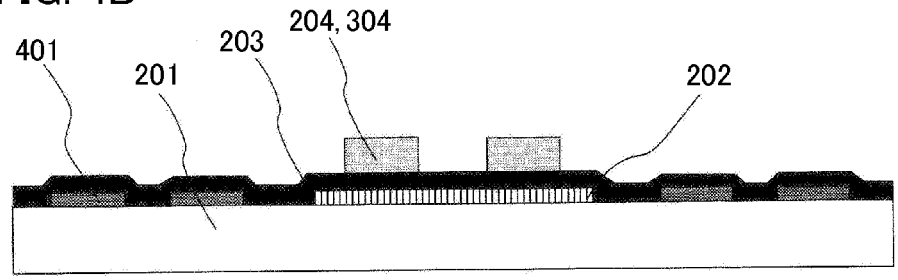
FIG. 4B is an illustrative diagram for explaining a second process step in the method of manufacturing the TMR magnetic sensor according to Embodiment 2 of the present invention.
Figure 4C:
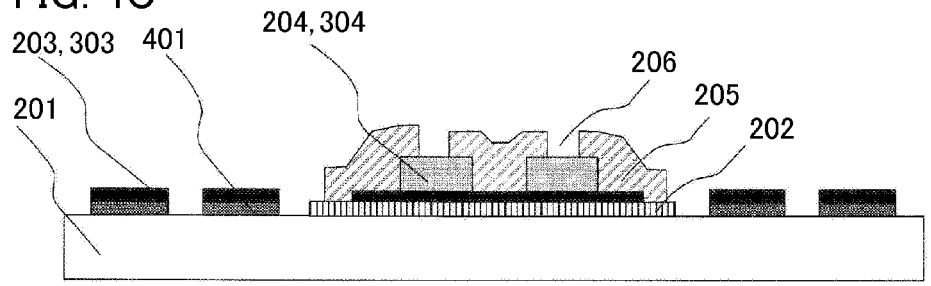
FIG. 4C is an illustrative diagram for explaining a third process step in the method of manufacturing the TMR magnetic sensor according to Embodiment 2 of the present invention.
Figure 4D:
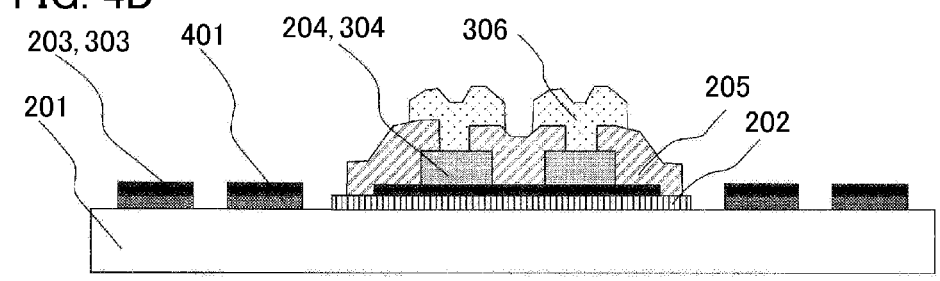
FIG. 4D is an illustrative diagram for explaining a fourth process step in the method of manufacturing the TMR magnetic sensor according to Embodiment 2 of the present invention.

Next, in order to form the metallic interconnect layers 306 at the fourth process step shown in FIG. 4D, an AlSiCu film is deposited until a desired film thickness is obtained, using physical vapor deposition (PVD) equipment. Note that, as for a material of the metallic interconnect layers 306, the material is not limited to the AlSiCu film if an electrical resistance value of the material is low, and it can obtain an ohmic contact with the TMR sensor element 304. In addition, the term "desired film thickness" here means a film thickness in which its reliability is maintained for at least ten years even when electrical and physical stresses are added to the metallic interconnect layers 306. That is to be straightforward, the film thickness of AlSiCu film means a film thickness in which its migration resistance is maintained.

Subsequently, in a similar manner when the contact holes 206 described above are formed, the AlSiCu film is removed into a desired pattern by subjecting it to etching using a photoengraving technique and an etching technique employing reactive ion etching (RIE) equipment, so that the pair of metallic interconnect layers 306 shown in FIG. 4D is formed.

Figure 4E:
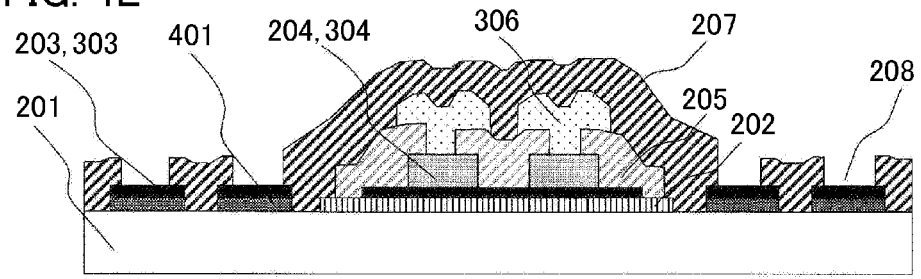
FIG. 4E is an illustrative diagram for explaining a fifth process step in the method of manufacturing the TMR magnetic sensor according to Embodiment 2 of the present invention.

Next, in order to protect the surface of the TMR magnetic sensor at the fifth process step shown in FIG. 4E, a silicon nitride film is, for example, deposited on the overall surface until the film thickness sufficiently secures the function as a desired passivation film 207, using plasma-enhanced chemical vapor deposition (PECVD) equipment. And lastly, by a photoengraving technique and reactive ion etching (RIE) equipment, the silicon nitride film is selectively removed by subjecting it to etching, so that the opening portions 208 are formed. According to the above, the TMR magnetic sensor 100 shown in FIG. 4E is finished that includes the TMR sensor element 304, and the conductive materials 303 for flowing static electricity on the side into the Si substrate 201.

Note that, in a case in which the TMR sensor element 304 and a control circuit of the TMR sensor element 304 are to be formed on the same semiconductor substrate, it is possible to form them thereon according to a similar manner described above, if the TMR-sensor-element forming region X is formed in advance.

According to the TMR magnetic sensor in Embodiment 2 of the present invention described above, it is needless to say that the sensor achieves those effects the same as the effects described in Embodiment 1; and in addition, because static electricity is likely to flow into the Si substrate 201 by the metal film 401 making an ohmic contact with the Si substrate 201 to its side, there exists an effect that static electricity withstand capabilities are further enhanced.

Embodiment 3

Figure 5:
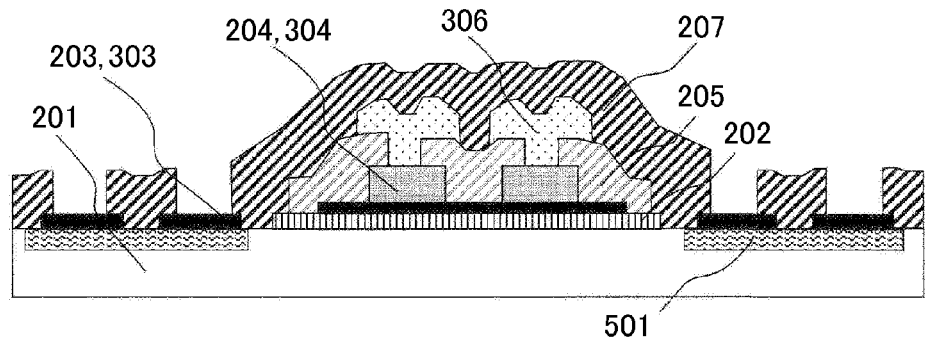
FIG. 5 is a cross-sectional diagram of a TMR magnetic sensor according to Embodiment 3 of the present invention.

FIG. 5 is a cross-sectional diagram of a TMR magnetic sensor according to Embodiment 3 of the present invention. In FIG. 5, by implanting an impurity in a high concentration at lower sides of the conductive materials 303 in the Si substrate 201 in advance using ion implantation equipment or the like, doping regions 501 are formed in which their electric resistivity is low. Subsequently, by passing through the process steps similar to those in Embodiment 1 described above, the TMR magnetic sensor 100 is finished that includes the Si substrate 201, the TMR sensor element 304, the doping regions 501 formed in the Si substrate 201, and the conductive materials 303 formed on the doping regions 501.

In the TMR magnetic sensor according to Embodiment 3 of the present invention, it is needless to say that the sensor achieves those effects the same as the effects described in Embodiment 1; and in addition, because static electricity is likely to flow on the side into the Si substrate 201 by the doping regions 501, there exists a feature that static electricity withstand capabilities are further enhanced.

Embodiment 4

Although not shown in the figures, a TMR magnetic sensor according to Embodiment 4 of the present invention is a sensor in which the metal film 401 of the TMR magnetic sensor in Embodiment 2 is formed on the doping regions 501. Other constituent items and things are equivalent or similar to those of the TMR magnetic sensor in Embodiment 3 described above.

In the TMR magnetic sensor according to Embodiment 4, it is needless to say that the sensor achieves those effects the same as the effects described in Embodiment 2; and in addition, because static electricity is likely to flow on the side into the Si substrate 201 by the doping regions 501, there exists a feature that static electricity withstand capabilities are further enhanced.

Embodiment 5

Figure 6:
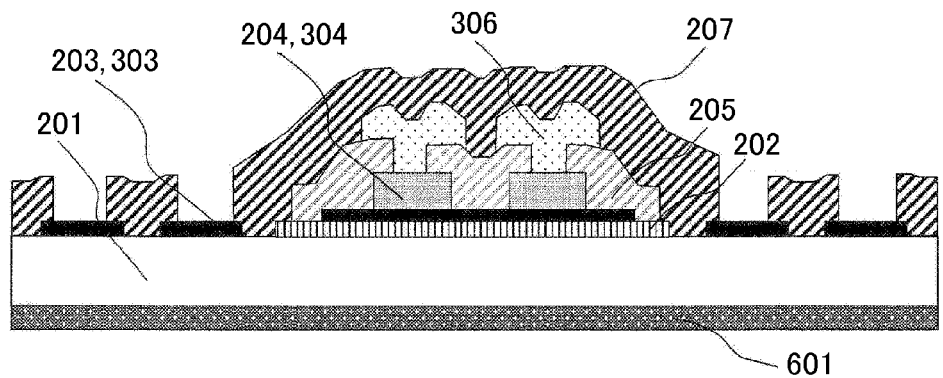
FIG. 6 is a cross-sectional diagram of a TMR magnetic sensor according to Embodiment 5 of the present invention.

FIG. 6 is a cross-sectional diagram of a TMR magnetic sensor according to Embodiment 5 of the present invention. In FIG. 6, on the back face of the Si substrate 201, a conductive film 601 of, for example, Au or the like is formed using physical vapor deposition (PVD) equipment. Subsequently, by the process steps similar to those in Embodiment 1 and Embodiment 2 described above, the TMR magnetic sensor is finished that includes the Si substrate 201, the TMR sensor element 304, the conductive materials 303, and the conductive film 601 formed on the back face of the Si substrate 201.

In the TMR magnetic sensor according to Embodiment 5 of the present invention, it is needless to say that the sensor achieves those effects the same as the effects described in Embodiment 1; and in addition, a feature resides in that, by using an electrically conductive die-bonding material of, for example, solder or the like as an electrode on the back face, countermeasure against static electricity can be strengthened in assembling process steps of the TMR magnetic sensor 100. In addition, the TMR magnetic sensor in Embodiment 5 is also applicable to those in Embodiment 2 and Embodiment 3, and thus it is needless to say that the effects equivalent to those described above can be obtained.

Embodiment 6

Figure 7:
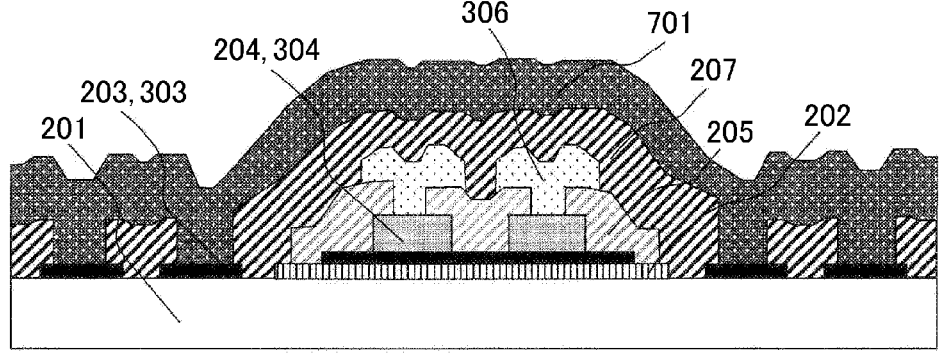
FIG. 7 is a cross-sectional diagram of a TMR magnetic sensor according to Embodiment 6 of the present invention.

FIG. 7 is a cross-sectional diagram of a TMR magnetic sensor according to Embodiment 6 of the present invention. In the TMR magnetic sensor illustrated in FIG. 7 according to Embodiment 6, a non-magnetic metal film 701 of AlSiCu or the like is, for example, deposited until a desired film thickness is obtained after the process step of FIG. 3G in the TMR magnetic sensor according to Embodiment 1, using physical vapor deposition (PVD) equipment, so that the non-magnetic metal film 701 takes the same voltage potential with the Si substrate 201 through the conductive materials 303. Note that, as for a material of the non-magnetic metal film 701, the material is not in particular limited to the AlSiCu film if an electrical resistance value of the material is low, and it can obtain an ohmic contact with the conductive materials 303.

In the TMR magnetic sensor according to Embodiment 6 of the present invention, it is needless to say that the sensor achieves those effects the same as the effects described in Embodiment 1; and in addition, because the non-magnetic metal film 701 and the Si substrate 201 take the same voltage potential with each other through the conductive materials 303, countermeasure against static electricity can be taken in a wider range. In addition, the TMR magnetic sensor in Embodiment 6 is also applicable to those in Embodiment 2, Embodiment 3, Embodiment 4 and Embodiment 5, and thus it is needless to say that the effects equivalent to those described above can be obtained.

Embodiment 7

Figure 8A:
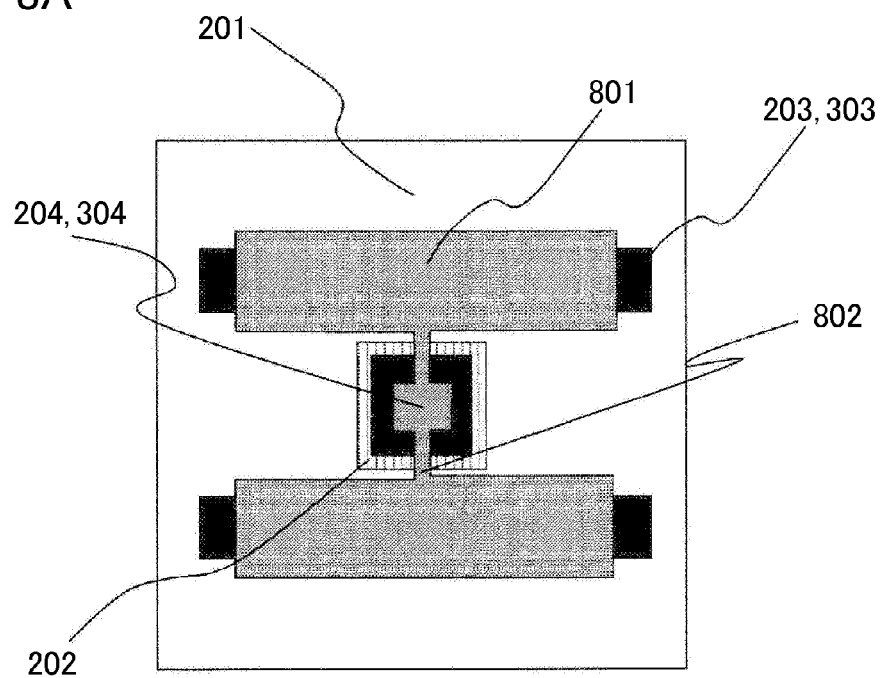
FIG. 8A is an illustrative diagram for explaining a first process step in a method of manufacturing a TMR magnetic sensor according to Embodiment 7 of the present invention.
Figure 8B:
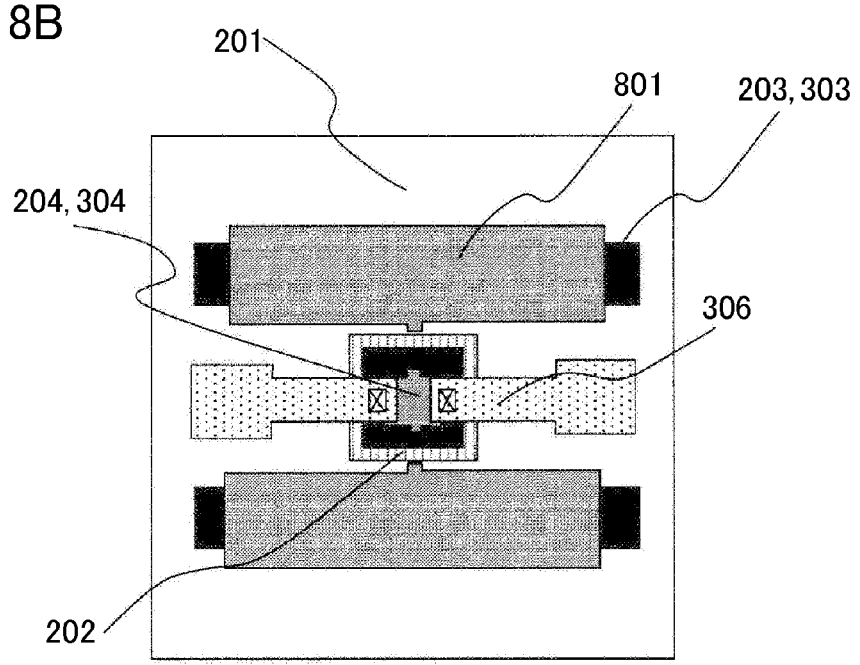
FIG. 8B is an illustrative diagram for explaining a second process step in the method of manufacturing the TMR magnetic sensor according to Embodiment 7 of the present invention.
Figure 8C:
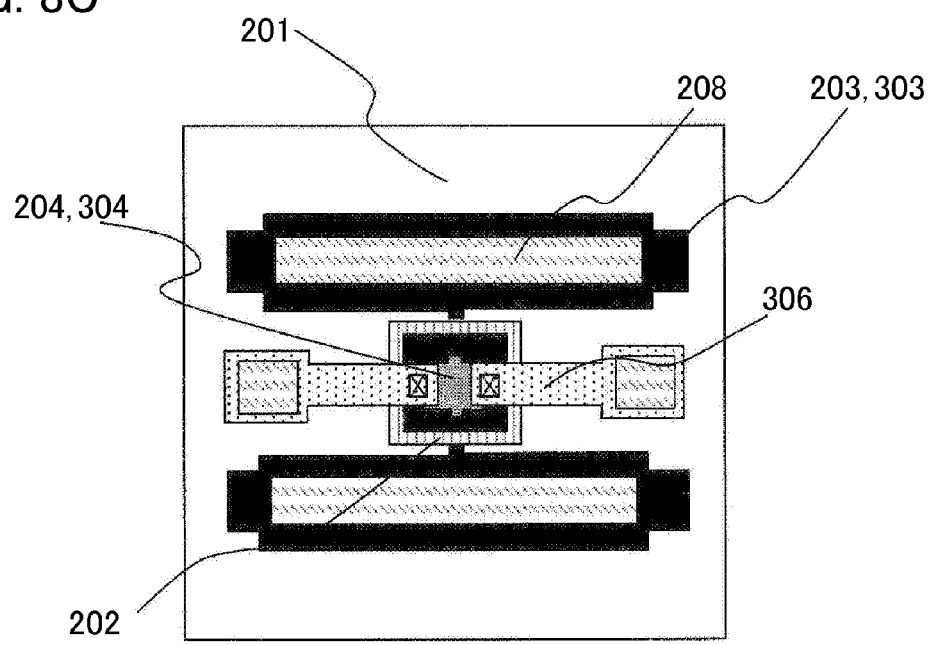
FIG. 8C is an illustrative diagram for explaining a third process step in the method of manufacturing the TMR magnetic sensor according to Embodiment 7 of the present invention.

FIG. 8A is an illustrative diagram for explaining a first process step in a method of manufacturing a TMR magnetic sensor according to Embodiment 7 of the present invention; FIG. 8B is an illustrative diagram for explaining a second process step in the method of manufacturing the TMR magnetic sensor according to Embodiment 7 of the present invention; and FIG. 8C is an illustrative diagram for explaining a third process step in the method of manufacturing the TMR magnetic sensor according to Embodiment 7 of the present invention. Hereinafter, the explanation will be made in succession for the method of manufacturing the TMR magnetic sensor according to Embodiment 7. Note that, FIG. 8A through FIG. 8C are the diagrams replaced for those top views extracted from the process steps in the manufacturing method according to Embodiment 1. In Embodiment 7 as will be explained hereinafter, these specific structures and the effects originated in those are only described, and, because other constituent items and things are equivalent or similar to those in Embodiment 1, their detailed explanation is omitted.

At the first process step shown in FIG. 8A, when the TMR film 204 is subjected to etching, the TMR sensor element 304, a TMR dummy element 801, and connecting portions 802 of the TMR sensor element 304 and the dummy element 801 are formed. In this case, any shape may be adopted for the TMR dummy element 801 if its area is larger than that of the TMR sensor element 304.

Next, when the metallic interconnect layers 306 are formed using etching at the second process step shown in FIG. 8B, the connecting portions 802 are removed, for example, by subjecting them to over-etching, so that the TMR sensor element 304 and the TMR dummy element 801 are separated to one another. Subsequently, the TMR magnetic sensor according to Embodiment 7 is finished, at the third process step shown in FIG. 8C, by removing the TMR dummy element 801 being subjected to etching, for example, using a technique of photoengraving or the like so that the conductive materials 303 are formed, and by forming the opening portions 208 on the conductive materials 303 in a similar manner to Embodiment 1.

In the TMR magnetic sensor according to Embodiment 7 of the present invention, it is needless to say that the sensor achieves those effects the same as the effects described in Embodiment 1; and in addition, because the TMR sensor element 304 and the TMR dummy element 801 take the same voltage potential with each other by way of the connecting portions 802 even in a case in which static elect is induced on the TMR sensor element 304 in a stage of wafer processing, the static electricity is discharged on the side into the TMR dummy element 801 having lower resistance by way of the connecting portions 802; for this reason, a feature resides in that static electricity withstand capabilities in the stage of wafer processing are higher. In addition, the TMR magnetic sensor in Embodiment 7 is also applicable to those in Embodiment 2, Embodiment 3, Embodiment 4, Embodiment 5 and Embodiment 6, and thus it is needless to say that the effects equivalent to those described above can be obtained.

The TMR magnetic sensor, and a method of manufacturing the same as set forth in Embodiments 1 through 7 of the present invention described above give a concrete form to at least any one of the inventions described below.

(1) A TMR magnetic sensor comprises a TMR sensor element formed on a first face of a substrate with an insulation film interposing therebetween; a conductive material formed on the first face of the substrate, being electrically connected to the substrate; and a passivation film surrounding a surface of the TMR sensor element and that of the conductive material, wherein at least a portion of the conductive material faces toward an opening portion formed in the passivation film.

According to this structure, because static electricity from the outside flows through the conductive material on the side into the substrate, breakdown of the element by the static electricity can be avoided. In addition, countermeasure against static electricity can be taken before the conductive material is fixed to a specific voltage potential.

(2) The TMR magnetic sensor as set forth in (1) described above is characterized in that the TMR magnetic sensor further comprises a lower electrode formed between the insulation film and the TMR sensor element.

According to this structure, because a resistance value of the conductive material can be reduced less than that of the TMR sensor element, countermeasure against static electricity can be strengthened. In addition, because manufacturing process steps of the TMR sensor element and those of the conductive material are made in common, countermeasure against static electricity can be taken from the time of forming the TMR sensor element, and in addition an increase in manufacturing costs can be curbed.

(3) The TMR magnetic sensor as set forth in (1) or (2) described above is characterized in that the substrate comprises, in a portion thereof, a doping region contacting to the conductive material.

According to this structure, because static electricity is likely to flow on the side into the substrate, countermeasure against static electricity can be strengthened.

(4) The TMR magnetic sensor as set forth in any one of (1) through (3) described above is characterized in that the substrate comprises a conductive film formed on a second face which mutually takes a relationship of either a front or back face with respect to the first face.

According to this structure, because static electricity is likely to flow on the side into a semiconductor package by using an electrically conductive die-bonding material, countermeasure against static electricity can be strengthened in assembling process steps.

(5) The TMR magnetic sensor as set forth in any one of (1) through (4) described above is characterized in that a portion of the conductive material is exposed to the exterior through the opening portion.

According to this structure, static electricity flows on the side into the substrate with a simpler structure, so that countermeasure against static electricity can be strengthened.

(6) The TMR magnetic sensor as set forth in any one of (1) through (4) described above is characterized in that the TMR sensor element and the passivation film are covered by a non-magnetic metal film, and the conductive material is electrically connected to the non-magnetic metal film through the opening portion.

According to this structure, because the non-magnetic metal film takes the same voltage potential with the substrate through the conductive material, countermeasure against static electricity can be strengthened.

(7) In a method of manufacturing the TMR magnetic sensor as set forth in any one of (1) through (6) described above, the method of manufacturing the TMR magnetic sensor is characterized in that the conductive material is made before a film formation of a TMR film to be forming the TMR sensor element therein.

According to this manufacturing method, because the conductive material being electrically connected to the substrate is formed before the film formation of TMR film, countermeasure against static electricity can be taken from an early stage of wafer processing.

(8) In a method of manufacturing the TMR magnetic sensor as set forth in (2) described above, the method of manufacturing the TMR magnetic sensor comprises the steps of: forming a TMR film to be forming the TMR sensor element therein; forming the TMR sensor element by processing the TMR film, using etching, into a desired shape, and at the same time forming a lower electrode and the conductive material; and forming in the passivation film the opening portion corresponding to at least a portion of the conductive material.

According to this manufacturing method, the effects similar to those of the TMR magnetic sensor as set forth in (2) described above can be obtained.

(9) In a method of manufacturing the TMR magnetic sensor as set forth in any one of (1) through (6) described above, the method of manufacturing the TMR magnetic sensor comprises the steps of: forming a TMR film to be forming the TMR sensor element therein; forming the TMR sensor element by processing the TMR film, using etching, into a desired shape, and at the same time forming a TMR dummy element being electrically connected to the conductive material, and a connecting portion electrically connecting between the TMR sensor element and the TMR dummy element; and separating the TMR sensor element from the conductive material to one another by cutting off the connecting portion.

According to this structure, because static electricity flows toward the side into the conductive material by way of the connecting portion(s) even if the static electricity produced at the time of wafer processing is induced in the TMR element portions, an effect of countermeasure against the static electricity can be strengthened at the time of wafer processing. By removing the connecting portion(s) at a following process step, the TMR sensor element and the conductive material are separated to one another, so that the TMR sensor element functions as a normal TMR sensor element after having finished the wafer processing.

Note that, while the present invention has been shown and described in detail, the foregoing description is in all aspects illustrative and not restrictive. It is therefore understood that, in the present invention, each of the embodiments can be freely combined, appropriately modified and/or eliminated without departing from the scope of the invention.

What is claimed is:

1. A TMR magnetic sensor comprising:
   a TMR sensor element formed on a first face of a substrate with an insulation film interposing therebetween;
   a conductive material formed on the first face of the substrate, the conductive material being electrically connected to the substrate and separated from the insulation film interposing between the TMR sensor element and the first face of the substrate; and
   a passivation film surrounding a surface of the TMR sensor element and that of the conductive material, wherein
   at least a portion of the conductive material faces toward an opening portion formed in the passivation film.

2. The TMR magnetic sensor as set forth in claim 1, further comprising a lower electrode formed between the insulation film and the TMR sensor element.

3. The TMR magnetic sensor as set forth in claim 1, wherein the substrate comprises, in a portion thereof, a doping region contacting to the conductive material.

4. The TMR magnetic sensor as set forth in claim 1, wherein the substrate comprises a conductive film formed on a second face which mutually takes a relationship of either a front or back face with respect to the first face.

5. The TMR magnetic sensor as set forth in claim 1, wherein a portion of the conductive material is exposed to the exterior through the opening portion.

6. The TMR magnetic sensor as set forth in claim 1, wherein
   the TMR sensor element and the passivation film are covered by a non-magnetic metal film, and
   the conductive material is electrically connected to the non-magnetic metal film through the opening portion.

7. A method of manufacturing the TMR magnetic sensor as set forth in claim 1, wherein said conductive material is made before a film formation of a TMR film to be forming the TMR sensor element therein.

8. A method of manufacturing the TMR magnetic sensor as set forth in claim 2, the method comprising the steps of:
   forming a TMR film to be forming the TMR sensor element therein;
   forming the TMR sensor element by processing the TMR film, using etching, into a desired shape, and at the same time forming the lower electrode and said conductive material; and forming in the passivation film the opening portion corresponding to at least a portion of said conductive material.

9. A method of manufacturing the TMR magnetic sensor as set forth in claim 1, the method comprising the steps of:
   forming a TMR film to be forming the TMR sensor element therein;
   forming the TMR sensor element by processing the TMR film, using etching, into a desired shape, and at the same time forming a TMR dummy element being electrically connected to said conductive material, and a connecting portion electrically connecting between the TMR sensor element and the TMR dummy element; and
   separating the TMR sensor element from said conductive material to one another by cutting off the connecting portion.

* * * * *